United States Patent
Suzuki et al.

(10) Patent No.: US 12,112,929 B2
(45) Date of Patent: Oct. 8, 2024

(54) CATHODE UNIT FOR MAGNETRON SPUTTERING APPARATUS AND MAGNETRON SPUTTERING APPARATUS

(71) Applicant: ULVAC, INC., Kanagawa (JP)

(72) Inventors: Koji Suzuki, Kanagawa (JP); Hideto Nagashima, Kanagawa (JP); Katsuya Hara, Kanagawa (JP); Hideki Mataga, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 104 days.

(21) Appl. No.: 17/891,809

(22) Filed: Aug. 19, 2022

(65) Prior Publication Data
US 2023/0138552 A1  May 4, 2023

(30) Foreign Application Priority Data

Oct. 29, 2021  (JP) ................... 2021-177108

(51) Int. Cl.
| H01J 37/34 | (2006.01) |
| C23C 14/34 | (2006.01) |
| C23C 14/35 | (2006.01) |

(52) U.S. Cl.
CPC ...... *H01J 37/3435* (2013.01); *C23C 14/3407* (2013.01); *C23C 14/35* (2013.01); *H01J 37/3405* (2013.01); *H01J 37/3497* (2013.01)

(58) Field of Classification Search
CPC .............. H01J 37/3435; H01J 37/3405; H01J 37/3497; C23C 14/3407; C23C 14/35
See application file for complete search history.

(56) References Cited

U.S. PATENT DOCUMENTS 5,565,071 A * 10/1996 Demaray ............ H01J 37/3497
                                                 204/192.12
10,685,821 B2 * 6/2020 Bhat ................... H01J 37/3497

FOREIGN PATENT DOCUMENTS

JP       7-331428 A     12/1995

OTHER PUBLICATIONS

"Fluid" definition. www.wikipedia.org [https://en.wikipedia.org/wiki/Fluid].*
"Fluid" definition. www.merriam-webster.com [https://www.merriam-webster.com/dictionary/fluid].*

* cited by examiner

*Primary Examiner* — Michael A Band
(74) *Attorney, Agent, or Firm* — Future IP LLC; Tomoko Nakajima

(57) ABSTRACT

A cathode unit for a magnetron sputtering apparatus includes a backing plate joined to an upper side opposed to a sputtering surface of a target set in a posture facing an inside of a vacuum chamber and a magnet unit disposed above the backing plate at an interval, a refrigerant passage through which a refrigerant can flow being formed in the backing plate, in which a surface pressure applying unit is provided, the surface pressure applying unit applying, toward an upper outer surface of the backing plate from above the backing plate, a surface pressure equivalent to pressure applied to an upper inner surface of the backing plate when the refrigerant is circulated.

3 Claims, 1 Drawing Sheet

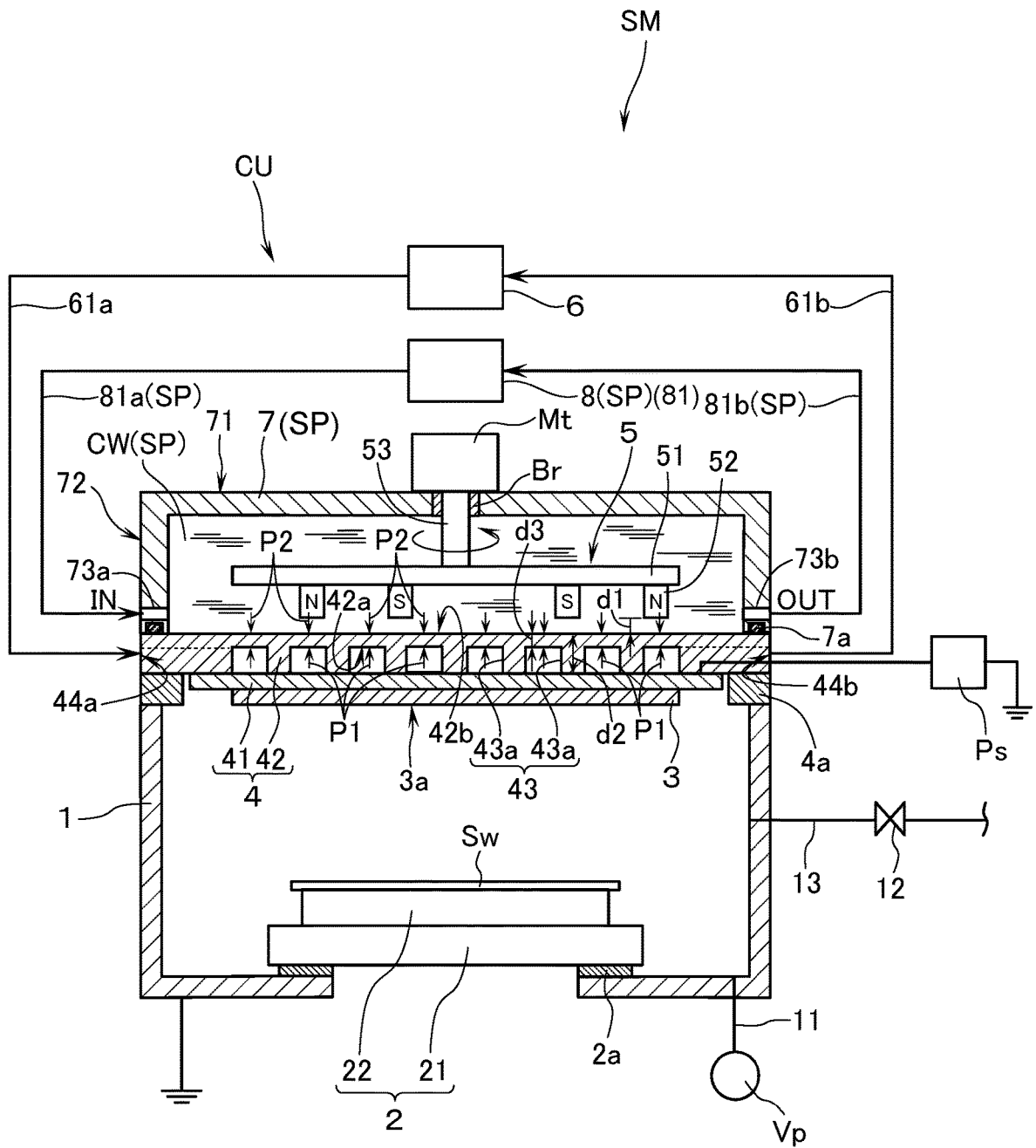

CATHODE UNIT FOR MAGNETRON SPUTTERING APPARATUS AND MAGNETRON SPUTTERING APPARATUS

This application is a claims priority under 35 U.S.C. § 119 to Japanese Patent Application No. 2021-177108, filed Oct. 29, 2021, which is incorporated by reference.

BACKGROUND OF THE INVENTION

1. Technical Field

The present invention relates to a cathode unit for a magnetron sputtering apparatus including a backing plate joined to an upper side opposed to a sputtering surface of a target placed in a posture facing the inside of a vacuum chamber and a magnet unit disposed above the backing plate at an interval, a refrigerant passage through which a refrigerant can flow being formed in the backing plate, and a magnetron sputtering apparatus including the cathode unit.

2. Description of the Related Art

The cathode unit for the magnetron sputtering apparatus of the above type has a structure in which radiant heat or the like from plasma generated during sputtering of the target is transferred from the surface of the target to the inside and is removed by a refrigerant such as cooling water flowing on the inside via the backing plate joined to the target. Such a so-called jacket-type backing plate generally includes a support plate joined to a side opposed to a sputtering surface of a target and a cover plate (a jacket) provided on the upper side of the support plate to form a refrigerant passage between the cover plate and the support plate (see, for example, JP 7-331428 A). At this time, since a magnet unit is disposed above the backing plate, when it is attempted to cause a leakage magnetic field to effectively act on a space below the sputtering surface while securing a flow rate of the refrigerant flowing through the refrigerant passage, the thickness of the support plate and the cover plate configuring the backing plate cannot be increased so much.

Incidentally, in recent years, for further productivity improvement, higher film forming speed is required for the sputtering apparatus of this type. High power exceeding, for example, 20 kW is supplied to the target at the time of film formation. Accordingly, it is required that heat can be more efficiently removed from the target. In such a case, it is conceivable to increase a supply pressure of the refrigerant to the refrigerant passage. However, if the thickness of the cover plate configuring the backing plate is small, the cover plate is deformed to expand upward by pressure applied to the cover plate when the refrigerant flows through the refrigerant passage. In some cases, there is a risk that the cover plate interferes with the magnet unit. In order to suppress such deformation of the backing plate, it is also conceivable to fix the support plate and the cover plate with a bolt crossing the refrigerant passage such that the cover plate (In particular, the central region) is pulled toward the support plate. However, in this case, the flow of the refrigerant changes in the refrigerant passage, and, on the contrary, heat is not efficiently removed from the target.

SUMMARY OF THE INVENTION

In view of the above points, an object of the present invention is to provide a cathode unit for a magnetron sputtering apparatus and a magnetron sputtering apparatus that can surely prevent interference between a backing plate and a magnet unit without impairing a function of efficiently removing heat from a target.

In order to solve the above problems, the present invention provides a cathode unit for a magnetron sputtering apparatus including: a backing plate joined to an upper side opposed to a sputtering surface of a target set in a posture facing an inside of a vacuum chamber; and a magnet unit disposed above the backing plate at an interval, a refrigerant passage through which a refrigerant can flow being formed in the backing plate, in which a surface pressure applying unit is provided, the surface pressure applying unit applying, toward an upper outer surface of the backing plate from above the backing plate, a surface pressure equivalent to pressure applied to an upper inner surface of the backing plate when the refrigerant is circulated. In the present invention, "equivalent" includes not only a case where the pressure applied to the upper inner surface of the backing plate strictly coincides with the surface pressure applied to the upper outer surface but also a case where the surface pressure is applied within a range in which the upper surface (or a part thereof) of the backing plate is not deformed to expand downward such that the sectional area of the fluid passage decreases.

In the present invention, it is possible to adopt a configuration in which the surface pressure applying unit includes a magnet case having a sealed structure that is connected to an upper surface of the backing plate and stores the magnet unit, and a fluid supplying unit that enables supply of fluid into the magnet case. In this case, if a circulating unit that circulates the fluid supplied into the magnet case is provided, a temperature rise of the refrigerant flowing through the refrigerant passage can be suppressed by heat exchange between the fluid circulating in the magnet case and the refrigerant flowing through the refrigerant passage in the backing plate. Heat can be more efficiently removed from the target.

According to the above, when the refrigerant is circulated at a predetermined supply pressure in the backing plate in order to cool the target during sputtering, the surface pressure is applied from the upper side to the upper outer surface of the backing plate even if the pressure is applied to the upper inner surface of the backing plate. Therefore, the backing plate is prevented from deforming to expand upward as much as possible. As a result, a deficiency that the backing plate interferes with the magnet unit does not occur. Moreover, since components such as bolts that hinder the flow of the refrigerant are absent in the refrigerant passage, the refrigerant can be smoothly circulated through the refrigerant passage in the backing plate. Therefore, the function of efficiently removing heat from the target is not impaired. Therefore, the present invention is suitable for supplying high power to the target during film formation by sputtering.

A magnetron sputtering apparatus of the present invention includes: the cathode unit described above; a vacuum chamber in which a target of the cathode unit is set in a posture facing an inside of the vacuum chamber and a substrate to be treated is disposed in a space in front of a sputtering surface; a sputtering power supply that supplies power to the target; and a gas introducing unit that enables introduction of a sputtering gas into the vacuum chamber in a vacuum atmosphere.

BRIEF DESCRIPTION OF THE DRAWINGS

FIG. 1 is a schematic diagram illustrating a configuration of a magnetron sputtering apparatus including a cathode unit of the present invention.

DETAILED DESCRIPTION

An embodiment of a cathode unit for a magnetron sputtering apparatus and a magnetron sputtering apparatus including the cathode unit of the present invention are explained below with reference to the drawing assuming that a coolant is cooling water having a predetermined temperature. In the following explanation, terms indicating directions such as up and down are based on FIG. 1.

Referring to FIG. 1, a magnetron sputtering apparatus SM includes a vacuum chamber 1. A vacuum pump Vp is connected to the vacuum chamber 1 via an exhaust pipe 11. The inside of the vacuum chamber 1 can be evacuated to a predetermined pressure (for example, $1 \times 10^{-5}$ Pa). A gas pipe 13 in which a mass flow controller 12 is interposed is connected to a side wall of the vacuum chamber 1. A rare gas (for example, argon gas) functioning as a sputtering gas with a controlled flow rate can be introduced into the vacuum chamber 1. The mass flow controller 12 configures a gas introducing unit of the present embodiment.

A stage 2 is provided in a lower part of the vacuum chamber 1. A substrate to be treated (hereinafter referred to as "substrate Sw") such as a silicon wafer can be held in a posture in which a film formation surface of the substrate Sw is directed upward. The stage 2 includes a base 21 provided on the lower wall of the vacuum chamber 1 via an insulator 2a and a chuck plate 22 provided on the base 21 and incorporating an electrode (not illustrated) for electrostatic chuck and can suck the substrate Sw by energizing the electrode with a not-illustrated chuck power supply.

A cathode unit CU of the present embodiment is provided in an upper part of the vacuum chamber 1. The cathode unit CU includes a target 3 having a contour (for example, circular) matching the substrate Sw, a metal backing plate 4 with high thermal conductivity joined to a side of the target 3 opposed to a sputtering surface 3a, and a magnet unit 5 that is disposed above the backing plate 4 at an interval d1 and causes a leakage magnetic field to act on a space below the sputtering surface 3a. The target 3 is manufactured according to a composition of a thin film to be formed on the substrate Sw such as aluminum, copper, or titanium nitride. An output from a sputtering power supply Ps is connected to the target 3. DC power having negative potential or AC power having a predetermined frequency can be supplied according to a target type.

The backing plate 4 is configured by joining a pair of metal support plates 41 and 42 having high thermal conductivity. The outer peripheral edge of the other support plate 42 is attached to the upper end of the side wall of the vacuum chamber 1 via the insulator 4a, whereby the target 3 joined to the backing plate 4 is set in a posture in which the sputtering surface 3a faces the inside of the vacuum chamber 1 and is opposed to the substrate Sw. One support plate 41 has an area slightly larger than that of the target 3 and is joined to a side of the target 3 opposed to the sputtering surface 3a. The other support plate 42 functioning as the cover plate has an area and a plate thickness d2 slightly larger than those of the one support plate 41. On the lower surface of the other support plate 42 opposed to one support plate 41, for example, a plurality of recessed grooves 43a extending from one side to the other side in the radial direction is formed. When a pair of support plates 41 and 42 is joined, a refrigerant passage 43 through which cooling water flows is marked off by the recessed grooves 43a.

A first inflow port 44a and a first outflow port 44b are provided to be opposed to each other on the outer surface of the backing plate 4. During sputtering of the target 3, the cooling water is supplied from a chiller unit 6 set outside the vacuum chamber 1 to the first inflow port 44a at a predetermined supply pressure. The cooling water having flowed through the refrigerant passage 43 is returned from the first outflow port 44b to the chiller unit 6, whereby the cooling water having a predetermined temperature is circulated in the backing plate 4. The plate thickness d2 of the other support plate 42 and a plate thickness d3 of the support plate 42 in a part where the recessed grooves 43a are present are set according to the distance in the up-down direction between the target 3 and the magnet unit 5 such that a leakage magnetic field from the magnet unit 5 can be caused to effectively act on the space below the sputtering surface 3a. In this case, pressure (hereinafter referred to as "first pressure P1") generated when the cooling water is circulated through the refrigerant passage 43 acts on a lower surface portion 42a of the support plate 42 (equivalent to the upper inner surface of the backing plate 4) in the part where the recessed grooves 43a are present.

A magnet case 7 having a sealed structure is connected to an upper surface 42b of the other support plate 42 via a seal member 7a. The magnet unit 5 is stored on the inside of the magnet case 7. The magnet unit 5 includes a yoke 51 and a plurality of magnet bodies 52 provided on the lower surface of the yoke 51. A rotating shaft 53 extending piercing through an upper wall section 71 of the magnet case 7 via a bearing Br also serving as a liquid-tight seal is coupled to the yoke 51. When the rotating shaft 53 is rotated by a motor Mt, the magnet unit 5 is driven to rotate at predetermined speed around the axis of the rotating shaft 53. A second inflow port 73a and a second outflow port 73b are provided to be opposed to each other on a side wall section 72 of the magnet case 7. During sputtering of the target 3, as explained above, the cooling water CW serving as the fluid is supplied to the second inflow port 73a by the chiller unit 8, through an inlet passage 81a of a circulating unit, at predetermined supply pressure and returned from the second outflow port 73b to the chiller unit 8, through an outlet passage 81b of the circulating unit, whereby the cooling water CW is circulated in the magnet case 7. At this time, surface pressure (hereinafter referred to as "second pressure P2") acts on the upper surface 42b of the other support plate 42 (equivalent to the upper outer surface of the backing plate 4), with which the cooling water CW is in contact, according to the weight and the pressure of the cooling water CW introduced into the magnet case 7.

As explained above, the components that cause the surface pressure to act according to the weight and pressure of the cooling water configure the surface pressure applying unit of the present embodiment. For example, the first pressure P1 and the second pressure P2 are made equivalent by controlling a circulation flow rate of the cooling water from the chiller unit 8. The term "equivalent" includes not only a case where the first pressure P1 applied to an upper inner surface 42a of the backing plate 4 and the second pressure P2 applied to an upper outer surface 42b strictly coincide with each other but also a case where the second pressure P2 is applied within a range in which the upper surface 42b (or a part thereof) of the backing plate 4 is not deformed to expand downward such that the sectional area of the refrigerant passage 43 decreases. The chiller unit 8 configures the fluid supplying unit and the circulating unit of the present embodiment and circulates the cooling water supplied into the magnet case 7. Therefore, it is possible to suppress a temperature rise of the cooling water flowing through the refrigerant passage 43 by heat exchange between the cooling water circulating in the magnet case 7 and the cooling water flowing through the refrigerant passage 43 in the backing plate 4.

When a predetermined thin film is formed on the surface of the substrate Sw by the sputtering apparatus SM, a sputtering gas is introduced into the vacuum chamber 1 in a vacuum atmosphere at a predetermined flow rate and power is supplied from the sputtering power supply Ps to the target 3. Then, plasma is generated in the vacuum chamber 1, the target 3 is sputtered by ions ionized in the plasma, and a predetermined thin film is formed on the surface of the substrate Sw. During the sputtering, the cooling water is circulated from the chiller unit 6 through the refrigerant passage 43 of the backing plate 4 at a predetermined supply pressure and the cooling water is circulated from the chiller unit 8 through the magnet case 7 at the predetermined supply pressure. At this time, a flow rate of the cooling water introduced into the magnet case 7 is controlled such that the equivalent second pressure P2 is applied to the upper outer surface 42b of the backing plate 4 according to the first pressure P1 applied to the upper inner surface 42a of the backing plate 4. Consequently, radiant heat or the like from plasma generated during the sputtering of the target 3 is transferred from the surface of the target 3 to the inside. Heat is removed by the cooling water flowing through the inside of the target 3 via the backing plate 4 joined to the target 3. The target 3 is adjusted to a fixed temperature or lower. In this case, for example, if the temperature of the cooling water introduced into the magnet case 7 is set to be equal to or lower than the temperature of the cooling water supplied to the refrigerant passage 43, a temperature rise of the cooling water flowing through the refrigerant passage 43 can be suppressed by heat exchange between the cooling water circulating in the magnet case 7 and the cooling water flowing through the refrigerant passage 43 in the backing plate 4. Heat can be more efficiently removed from the target 3.

As explained above, according to the present embodiment, even if the first pressure P1 is applied to the upper inner surface 42a of the backing plate 4 by circulating the refrigerant through the refrigerant passage 43 during sputtering, since the second pressure P2 is applied from above the backing plate 4 toward the upper outer surface 42b, the support plate 42 of the backing plate 4 is prevented from being deformed to expand upward. As a result, a deficiency that the support plate 42 interferes with the magnet unit 5 does not occur. Moreover, since the support plate 41 and the support plate 42 are not fixed by bolts or the like crossing the refrigerant passage 43, components such as bolts that hinder the flow of the cooling water are absent in the refrigerant passage 43. Therefore, the cooling water can be smoothly circulated through the refrigerant passage 43. Therefore, the function of being able to efficiently remove heat from the target 3 is not impaired.

The embodiment of the present invention is explained above. However, various modifications can be made without departing from the scope of the technical idea of the present invention. In the above embodiment, the backing plate 4 configured by joining the pair of metal support plates 41 and 42 having high thermal conductivity is explained as an example. However, the present invention is not limited to such a form of the backing plate 4 and can be widely applied to, regardless of whether the backing plate 4 is integrated, a case where there is a risk that the backing plate 4 is deformed to expand upward during sputtering and interferes with the magnet unit 5. In the above embodiment, a case where the cooling water is used as the fluid supplied into the magnet case 7 is explained as an example. However, the present invention is not limited to this if the surface pressure can be applied to the upper outer surface 42b of the support plate 42. For example, gas such as an argon gas can be used as the fluid. In this case, the gas only has to be introduced into the magnet case 7 to pressurize the inside of the magnet case 7 pressure higher than the atmospheric pressure and apply the surface pressure to the upper surface 42b of the backing plate 4. On the other hand, it is also possible to provide a pressing plate that is disposed not to interfere with the magnet unit driven to rotate in the magnet case 7 and comes into contact with the upper surface 42b of the backing plate 4 and mechanically apply the surface pressure to the upper surface 42b of the backing plate 4 using an air cylinder or the like.

EXPLANATION OF THE REFERENCE NUMERALS

SM: Sputtering Apparatus
Sw: Substrate (substrate to be processed)
1: Vacuum Chamber
12: mass flow controller (Component(s) of gas introduction means
3: Target
3a: sputtering surface
4: backing plate
42a: upper inner surface of the backing plate
42b: upper outer surface of the backing plate
43: refrigerant passage
5: Magnet Unit
6: Chiller unit
7: Magnet Case (component(s) of surface pressure applying unit)
8: Chiller Unit (component(s) of surface pressure applying unit; fluid supplying unit; circulating unit)
Ps: Sputtering power supply

What is claimed is:
1. A cathode unit for a magnetron sputtering apparatus comprising:
a backing plate joined to an upper side opposed to a sputtering surface of a target set in a posture facing an inside of a vacuum chamber and comprising two support plates that are joined together, wherein a refrigerant passage is formed by the two support plates; and
a magnet unit disposed above the backing plate at an interval, the refrigerant passage through which a refrigerant configured to flow at a first pressure on an upper inner surface of the backing plate by an inflow port and an outflow port,
wherein a surface pressure applying unit is provided, the surface pressure applying unit applying, toward an upper outer surface of the backing plate at a second pressure on the upper outer surface, the second pressure equivalent to the first pressure by the refrigerant applied to the upper inner surface of the backing plate when the refrigerant is circulated, and
wherein the surface pressure applying unit includes a magnet case filled with the refrigerant and having a sealed structure that is connected to an upper outer surface of the backing plate and that stores the magnet unit, and the refrigerant is directly contacting the magnet case, wherein a circulating unit that is connected to the magnet case is provided, the refrigerant between the magnet case and a fluid supplying unit being circulated to flow at the second pressure on the upper outer surface of the backing plate by an inflow port and an outflow port, the magnet case, the inflow port, and the outflow port connects a chiller unit of the circulating unit and the upper outer surface backing plate.

2. The cathode unit for the magnetron sputtering apparatus according to claim 1, wherein the surface pressure applying unit includes the fluid supplying unit that enables supply of refrigerant into the magnet case.

3. The magnetron sputtering apparatus comprising: the cathode unit for the magnetron sputtering apparatus according to claim 1;

a vacuum chamber in which the target of the cathode unit is set in a posture facing the inside of the vacuum chamber and a substrate to be treated is disposed in a space in front of the sputtering surface;

a sputtering power supply that supplies power to the target; and a gas introducing unit that enables introduction of a sputtering gas into the vacuum chamber in a vacuum atmosphere.

* * * * *